(12) United States Patent
Jarvis

(10) Patent No.: US 7,671,488 B1
(45) Date of Patent: Mar. 2, 2010

(54) VOLTAGE SUBSTITUTION DEVICE AND METHOD OF USE THEREOF

(75) Inventor: Ralph R. Jarvis, Tulsa, OK (US)

(73) Assignee: Jarvis, Inc., Tulsa, OK (US)

( * ) Notice: Subject to any disclaimer, the term of this patent is extended or adjusted under 35 U.S.C. 154(b) by 334 days.

(21) Appl. No.: 11/939,958

(22) Filed: Nov. 14, 2007

Related U.S. Application Data

(60) Provisional application No. 60/982,921, filed on Oct. 26, 2007.

(51) Int. Cl.
*H02J 1/00* (2006.01)
*H01H 31/02* (2006.01)
*G08B 29/00* (2006.01)

(52) U.S. Cl. .......................... 307/80; 324/556; 340/514

(58) Field of Classification Search ................... 307/80; 324/98, 555, 556; 340/514, 515
See application file for complete search history.

(56) References Cited

U.S. PATENT DOCUMENTS 5,157,708 A * 10/1992 Garthwaite et al. ........... 379/21
5,369,371 A * 11/1994 Eaton .......................... 324/707
6,259,169 B1 * 7/2001 Cadieux et al. ............. 307/10.6
D476,245 S * 6/2003 Tanaka et al. ................ D10/75

\* cited by examiner

*Primary Examiner*—Albert W Paladini
*Assistant Examiner*—Michael Rutland Wallis
(74) *Attorney, Agent, or Firm*—Head, Johnson & Kachigian, P.C.

(57) ABSTRACT

A voltage substitution device and method of use thereof, wherein the voltage substitution device may include at least two voltage meter modules, a variable DC to DC converter, at least two leads, a switch, a variable resistor and at least two power supplies. One power supply provides power to the voltage meter modules, while the other power supply provides power for the variable DC to DC converter. The leads may be attached to alarm sensor wires, and one voltage meter module displays the voltage across the sensor wires. The output voltage of the variable DC to DC converter may be displayed on the second voltage meter module. The variable resistor may be adjusted to vary the output voltage of the DC to DC converter to match the voltage across the sensor wires. Once the voltages are matched, the switch may be closed to place the output voltage of the DC to DC converter onto the leads and in parallel with the sensor wires.

13 Claims, 3 Drawing Sheets

VOLTAGE SUBSTITUTION DEVICE AND METHOD OF USE THEREOF

CROSS-REFERENCE

This application claims the benefit to U.S. Provisional Application No. 60/982,921, filed Oct. 26, 2007, which is herein incorporated by reference.

STATEMENT REGARDING FEDERALLY SPONSORED RESEARCH OR DEVELOPMENT

Not Applicable.

REFERNCE TO A SEQUENCE LISTING, A TABLE, OR COMPUTER PROGRAM LISTING COMPACT DISC APPENDIX

Not Applicable.

BACKGROUND OF THE INVENTION

1. Field of the Invention

This invention relates to a voltage substitution device and method of use thereof, in particular, to a voltage substitution device and method to bypass a voltage and current supervised alarm sensor.

2. Prior Art

Resistive substitution is a known method of bypassing an alarm sensor that is voltage and current supervised, i.e., a closed circuit having a resistor at a sensing end. Resistive substitution involves substituting the resistor at the sensing end of a closed circuit by cutting the sensor from the circuit and switching in a properly sized resistor. Under this method, the voltage and current on the sensor wires are measured, and using Ohm's law, the value of the resistor located at the sensing end of the circuit is calculated. Once the voltage of the resistor is known, a resistor of equal value is switched in by placing it in parallel with the sensor while simultaneously taking or cutting the sensor out of the circuit.

It is therefore desirable to provide an improved method for bypassing a voltage and current supervised alarm sensor that does not require the sensor to be cut from the circuit.

It is further desirable to provide a device that requires minimal electronic measurements and calculations by a technician.

It is further desirable to provide a device and method that decreases the likelihood of a technician making a mistake resulting in an alarm.

SUMMARY OF THE INVENTION

In general, in a first aspect, the invention relates to a voltage substitution device having a first and second voltage meter modules connected to a first power supply. A voltage regulator having a variable DC to DC converter, a variable resistor and a fixed resistor is connected to a second power supply. The output voltage of the voltage regulator may be varied by adjusting the variable resistor. A pair of leads are connected through a switch to the output voltage of the voltage regulator. The leads may be connected to alarm sensor wires by a technician. The first voltage meter module may display the voltage of the sensor wires, while the second voltage meter module may display the output voltage of the voltage regulator. When the voltage being displayed on the first and second voltage meter modules are the same, the technician may close the switch causing the output voltage of the voltage regulator to be placed on the leads. The leads are thus connected in parallel to the alarm sensor wires.

In general, in a second aspect, the invention relates to a method of voltage substitution involving attaching a pair of leads to a set of alarm sensor wires. Once the leads are attached, the voltage of the sensor wires may be measured and display on a first voltage meter module. An output voltage of a DC to DC converter may be displayed on a second voltage meter module, allowing a technician to adjust the output voltage using a variable resistor. Once the output voltage displayed on the second voltage meter module equals the voltage of the sensor wires displayed on the first voltage meter module, the technician may bypass the sensor wires by closing a switch causing the output voltage to be placed onto the leads and in parallel with the sensor wires.

Other advantages and features will be apparent from the following description, and from the claims.

DETAILED DESCRIPTION OF THE PREFERRED EMBODIMENTS

The devices and methods discussed herein are merely illustrative of specific manners in which to make and use the invention and are not to be interpreted as limiting in scope.

While the devices and methods have been described with a certain degree of particularity, it is to be noted that many modifications may be made in the details of the construction and the arrangement of the devices and methods components without departing from the spirit and scope of this disclosure. It is understood that the devices and methods are not limited to the embodiments set forth herein for purposes of exemplification.

Figure 1:
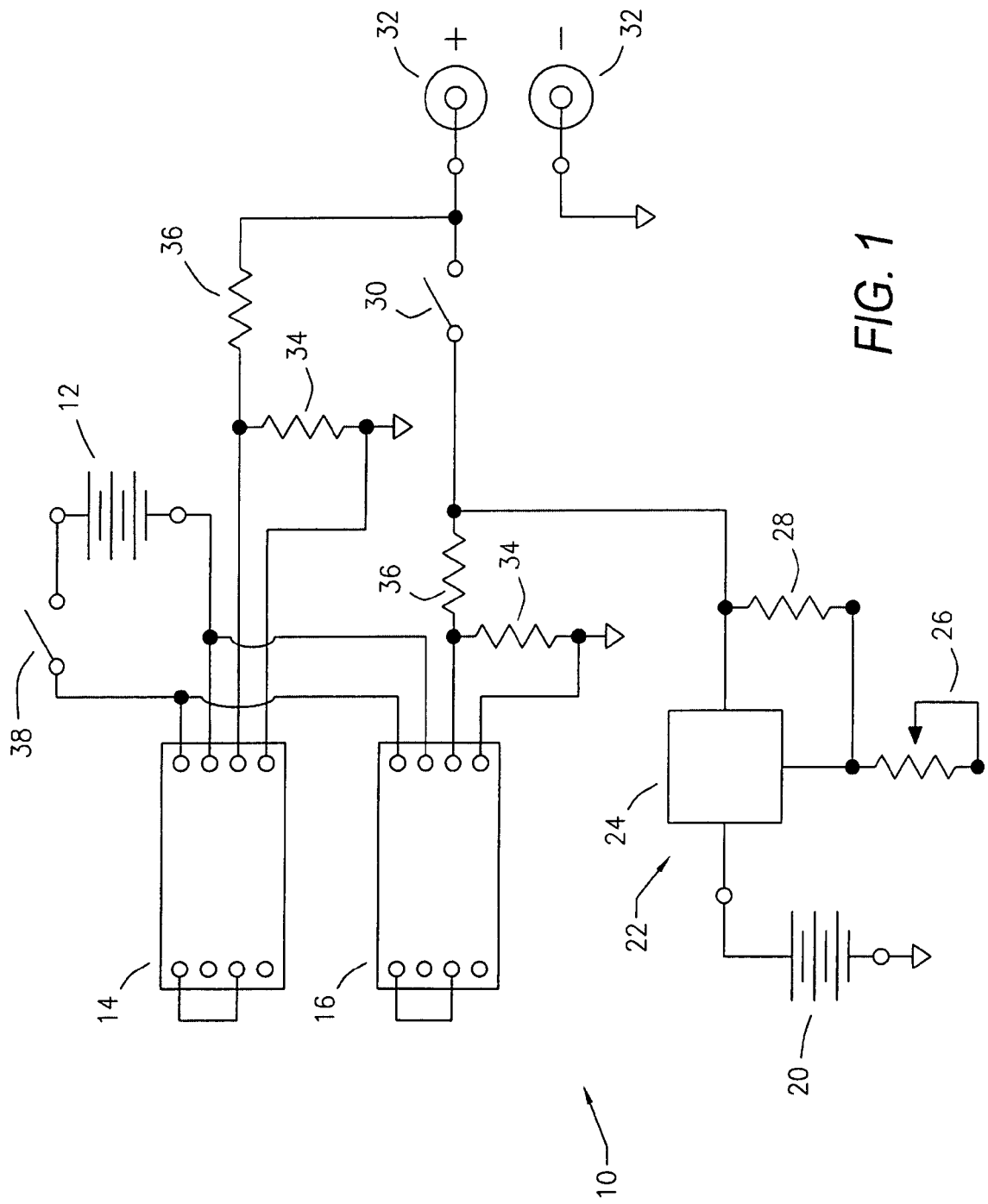
FIG. 1 is a schematic diagram of the voltage substitution device disclosed herein.

Referring to the figures in detail, FIG. 1 illustrates a schematic diagram of the voltage substitution device 10. As seen in FIG. 1, a first power source 12 supplies power to a first voltage meter module 14 and to a second voltage meter module 16. A second power source 20 supplies power to a voltage regulator 22, which results in an output voltage. The voltage regulator 22 may include a variable DC to DC converter 24, a variable resistor 26 and a fix resistor 28. The output voltage of the voltage regulator 22 is connected through a switch 30 to a pair of leads 32. The leads 32 may be attached by a technician to a set of alarm sensor wires (not shown). The alarm sensor wires may be part of a closed circuit having a resistor at the sensing end of the circuit. The voltage of the sensor wires may be displayed on the first voltage meter module 14. The technician may then adjust the output voltage of the voltage regulator 22, which is displayed on the second voltage meter module 16, to match the voltage of the sensor wires as displayed on the first voltage meter module 14. Once the output voltage of the voltage regulator 22 has been adjusted to the same as being read across the sensor wires, the technician may close the switch 30 connecting the voltage meter 22 to the leads 32, causing the output voltage of the voltage regulator 22 to be placed on the leads 32 and across the sensor wires. The voltage regulator 22 is now in parallel with the sensor wires, thus effectively bypassing the sensor wires.

The voltage regulator 22 may be comprised of a three terminal DC to DC converter 24 (LM317), a fixed resistor 28 (240 ohm) and a variable resistor or potentiometer 26 (10 k ohm). The voltage regulator 22 is powered by the second power source 20. As shown in FIG. 1, the second power source 20 may a 9 volt battery, capable of being adjusted for an output voltage range 1.2 volts to 8.5 volts. This voltage range covers all currently known alarms systems, but it should be appreciated that if a system is encountered having more than 8.5 volts, the voltage regulator 22 may be powered by a larger power supply. For example, when a 12 volt battery is provided as the second power source 20, the voltage output may be adjusted to provide up to 11 volts. The output voltage of the voltage regulator 22 is adjusted to the desired voltage by adjusting the variable resistor or potentiometer 26.

The output voltage of the voltage regulator 22 is also connected through switch 30 to leads 32. Switch 30 may be a single pole, single through switch. The technician may attach leads 32 to the sensor wires (not shown) and the first voltage meter module 14 displays the voltage of the sensor wires. The second voltage meter module 16 displays the output voltage of voltage regulator 22. The technician may adjust the voltage regulator's 22 voltage output using potentiometer 26 to match the voltage across the sensor wires. Once the output voltage of the voltage regulator 22 is equal to the voltage across the sensor wires, the technician may close switch 30 to bypass the voltage across the sensor wires, and thus placing the voltage substitution device 10 in parallel with the sensor wires.

The first voltage meter module 14 and the second voltage meter module 16 may be eight (8) pin liquid crystal display (LCD) voltage meter modules (Martel Electronics). The full scale reading of the voltage meter modules 14, 16 may be altered by placing a first resistor 34 (1 M ohm) in series with the voltage input from the first power source 12, while simultaneously placing a second resistor 36 (10 k ohm) in parallel with the input voltage from the first power source 12, as shown in FIG. 1. Pins 5 and 6 of the voltage meter modules 14, 16 are then shorted together. The first and second voltage meter modules 14, 16 may be calibrated by adjusting a built-in potentiometer (not shown) to a multimeter (Fluke 87) (not shown).

A second switch 38 may be provided to open and close the circuits between the voltage meter modules 14, 16, allowing the device 10 to be turned on and off.

Figure 2:
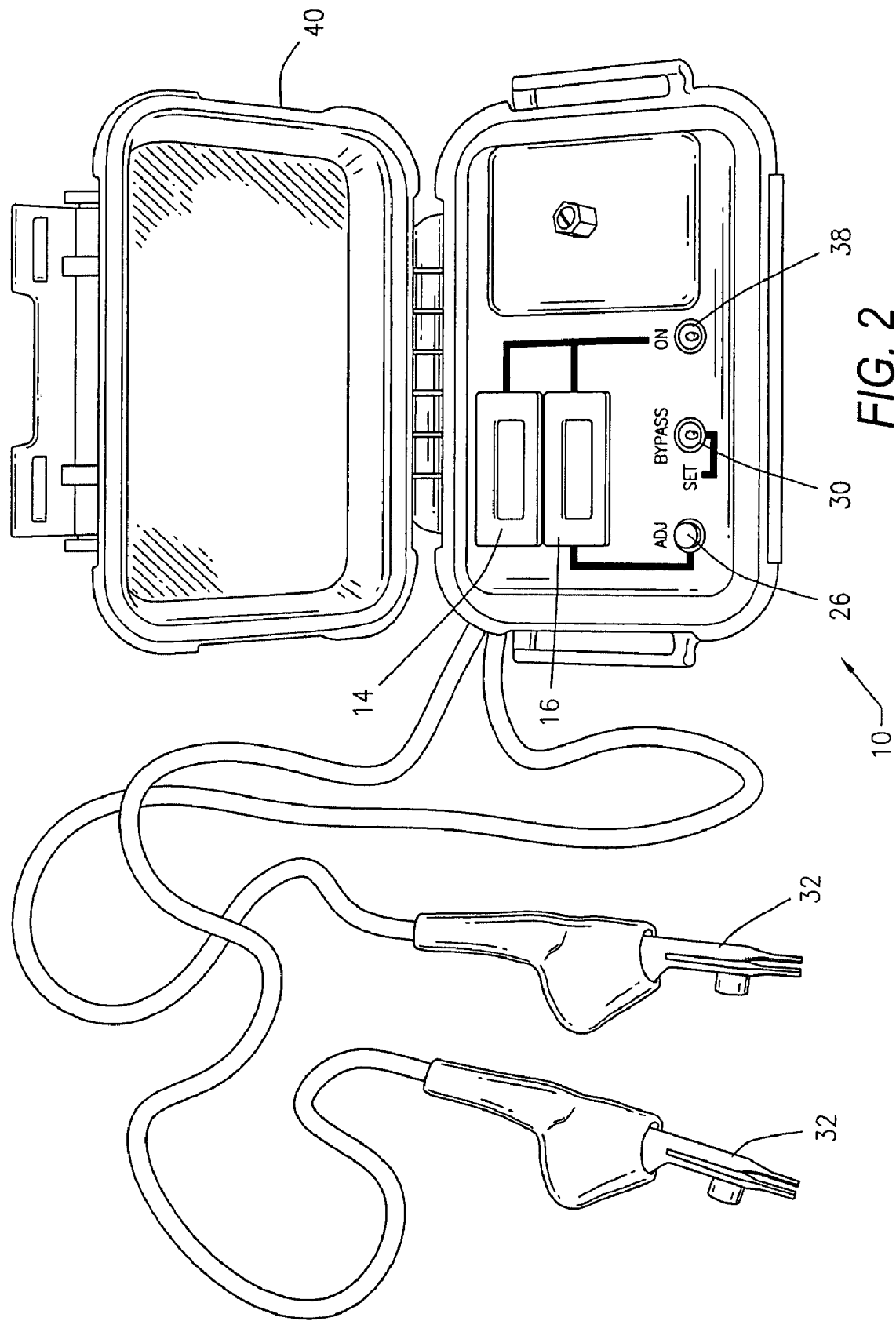
FIG. 2 is a perspective view of the voltage substitution device disclosed herein.

FIG. 2 illustrates a perspective view of the voltage substitution device 10. As seen in FIG. 2, the voltage substitution device 10 comprises housing 40, which encases a first and second power source (not shown). A first voltage meter 14 displays the voltage across the sensor wires, which are read using a pair of leads 32. A second voltage meter module 16 may be adjusted using a variable resistor or potentiometer 26. The second voltage meter module 16 displays the output voltage of a voltage regulator (not shown), which may be adjusted using potentiometer or variable resistor 26. Once the output voltage of the voltage regulator as displayed on the second voltage meter module 16 is equal to the voltage across the sensor wires, a technician may close switch 30 to bypass the voltage across the sensor wires as displayed on first voltage meter module 14, and thus placing the voltage substitution device parallel with the sensor wires. Switch 38 is also provided within housing 40 of voltage substitution device 10 allowing the device to be turned on and off for use.

Figure 3:
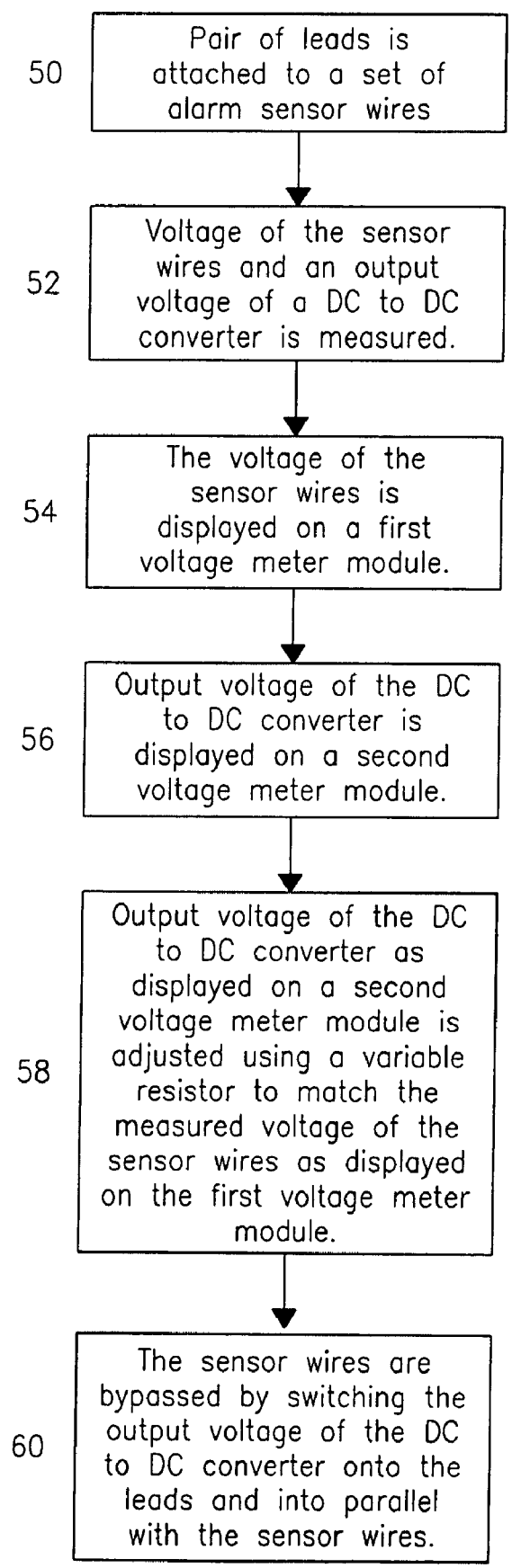
FIG. 3 is a flow chart of the method of voltage substitution disclosed herein.

As shown in FIG. 3, a method of voltage substitution is also provided wherein a pair of leads is attached to a set of alarm sensor wires 50. The voltage of the sensor wires and an output voltage of a DC to DC converter is measured 52 and displayed on a first voltage meter module 54 and a second voltage meter module 56, respectively. The output voltage of the DC to DC converter as displayed the second voltage meter module is adjusted using a variable resistor to match the measured voltage of the sensor wires as displayed on the first voltage meter module 58. The sensor wires are bypassed by switching the output voltage of the DC to DC converter onto the leads and into parallel with the sensor wires 60. The alarm sensor wires may be a voltage and current supervised closed circuit having a resistor at a sensing end. The method of voltage substitution may also include powering the first and second voltage meter modules using a first power supply. The method of voltage substitution may further include powering the variable DC to DC converter using a second power supply.

Whereas, the devices and methods have been described in relation to the drawings and claims, it should be understood that other and further modifications, apart from those shown or suggested herein, may be made within the spirit and scope of this invention.

What is claimed is:

1. A voltage substitution device, comprising:
   first and second voltage meter modules connected to a first power supply;
   a voltage regulator comprising a variable DC to DC converter, a variable resistor and a fixed resistor connected to a second power supply, wherein the output voltage of said voltage regulator is varied by adjusting said variable resistor;
   a pair of leads connected through a switch to said output voltage of said voltage regulator, wherein said leads are connected in parallel to a set of alarm sensor wires; and
   wherein said first voltage meter module displays the voltage of said sensor wires; wherein said second voltage meter module displays the output voltage of said voltage regulator.

2. The voltage substitution device of claim 1 wherein said first power supply is a 9 volt battery.

3. The voltage substitution device of claim 1 wherein said second power supply is a 9 volt battery.

4. The voltage substitution device of claim 1 wherein said first and second voltage meter modules are 8 pin LCD voltage meter modules.

5. The voltage substitution device of claim 1 wherein said alarm sensor wires comprise a voltage and current supervised closed circuit having a resistor at a sensing end.

6. The voltage substitution device of claim 1 wherein said variable DC to DC converter is a three terminal DC to DC converter.

7. The voltage substitution device of claim 1 further comprising an on/off switch connected between said first power supply and said first and second voltage meter modules.

8. The voltage substitution device of claim 1 wherein the connection between said first and second voltage meter modules and said first power supply further comprises a resistor in series with the input voltage from the first power supply and a resistor in parallel with the input voltage of the first power supply.

9. The voltage substitution device of claim 1 further comprising a housing.

10. A method of voltage substitution, comprising the steps of:
    attaching a pair of leads to a set of alarm sensor wires;
    measuring the voltage across said sensor wires;
    displaying said voltage of said sensor wires on a first voltage meter module;
    measuring an output voltage of a DC to DC converter;
    displaying said output voltage of a DC to DC converter on a second voltage meter module;

adjusting said output voltage of said DC to DC converter using a variable resistor to match the measured voltage of said sensor wires; and bypassing said sensor wires by switching said output voltage of said DC to DC converter onto said leads and into parallel with said sensor wires.

11. The method of voltage substitution of claim 10 wherein said alarm sensor wires comprise a voltage and current supervised closed circuit having a resistor at a sensing end.

12. The method of voltage substitution of claim 10 further comprising the step of powering said first and second voltage meter modules using a first power supply.

13. The method of voltage substitution of claim 10 further comprising the step of powering said variable DC to DC converter using a second power supply.

* * * * *